(12) United States Patent
Xu et al.

(10) Patent No.: US 9,312,290 B2
(45) Date of Patent: Apr. 12, 2016

(54) SENSOR AND METHOD FOR FABRICATING THE SAME

(71) Applicant: BEIJING BOE OPTOELECTRONICS TECHNOLOGY CO., LTD., Beijing (CN)

(72) Inventors: Shaoying Xu, Beijing (CN); Zhenyu Xie, Beijing (CN); Xu Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 25 days.

(21) Appl. No.: 14/128,263

(22) PCT Filed: Nov. 23, 2012

(86) PCT No.: PCT/CN2012/085186
§ 371 (c)(1),
(2) Date: Dec. 20, 2013

(87) PCT Pub. No.: WO2014/015592
PCT Pub. Date: Jan. 30, 2014

(65) Prior Publication Data
US 2015/0221688 A1 Aug. 6, 2015

(30) Foreign Application Priority Data
Jul. 26, 2012 (CN) .......................... 2012 1 0262839

(51) Int. Cl.
*H01L 31/0352* (2006.01)
*H01L 21/00* (2006.01)
(Continued)

(52) U.S. Cl.
CPC .... *H01L 27/14612* (2013.01); *H01L 27/14603* (2013.01); *H01L 27/14636* (2013.01);
(Continued)

(58) Field of Classification Search
CPC ............... H01L 27/14612; H01L 27/14603; H01L 27/14636; H01L 27/14638; H01L 27/14689; H01L 27/14692; H01L 31/022466

USPC .................................................. 257/287–297
See application file for complete search history.

(56) References Cited

U.S. PATENT DOCUMENTS 9,048,161 B2 * 6/2015 Xu .................... H01L 27/14676
438/155
2003/0201396 A1 * 10/2003 Lee .................... H01L 27/14658
250/370.09
(Continued)

FOREIGN PATENT DOCUMENTS

CN 102237412 A 11/2011
CN 102790064 A 11/2012
(Continued)

OTHER PUBLICATIONS

International Preliminary Report on Patentability dated Jan. 27, 2015; PCT/CN2012/085186.
(Continued)

*Primary Examiner* — Marcos D Pizarro Crespo
*Assistant Examiner* — Nelson Garces
(74) *Attorney, Agent, or Firm* — Ladas & Parry LLP

(57) ABSTRACT

A sensor and its fabrication method are provided, wherein the sensor includes: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein the TFT device is a top gate TFT. The photodiode sensing device includes: a receiving electrode connected with a source electrode, a photodiode disposed on the receiving electrode, a transparent electrode disposed on the photodiode, and a bias line disposed on and connected with the transparent electrode, the bias line is disposed as parallel to the gate line. In comparison with the conventional technology, the method for fabricating the sensor of the invention reduces the number of mask as well as the production cost and simplifies the production process, thereby significantly improves the production capacity and the defect free rate.

11 Claims, 9 Drawing Sheets

(51) Int. Cl.
  *H01L 27/146* (2006.01)
  *H01L 29/04* (2006.01)
  *G02F 1/1343* (2006.01)
  *G01T 1/24* (2006.01)
  *H01L 31/0224* (2006.01)

(52) U.S. Cl.
  CPC .... *H01L27/14638* (2013.01); *H01L 27/14658* (2013.01); *H01L 27/14689* (2013.01); *H01L 27/14692* (2013.01); *H01L 31/022466* (2013.01); *H01L 31/0352* (2013.01)

(56) References Cited

U.S. PATENT DOCUMENTS

| | | | | |
|---|---|---|---|---|
| 2009/0026509 | A1* | 1/2009 | Hayashi | H01L 27/14603 257/292 |
| 2011/0260168 | A1* | 10/2011 | Toyota | H01L 29/42384 257/59 |
| 2014/0231804 | A1* | 8/2014 | Yan | H01L 27/1214 257/53 |
| 2014/0342490 | A1* | 11/2014 | Xu | H01L 27/14687 438/59 |
| 2015/0008435 | A1* | 1/2015 | Xu | H01L 27/1461 257/66 |
| 2015/0014751 | A1* | 1/2015 | Li | H01L 27/14632 257/229 |
| 2015/0041870 | A1* | 2/2015 | Xu | H01L 27/14676 257/290 |

FOREIGN PATENT DOCUMENTS

| | | |
|---|---|---|
| CN | 102790066 A | 11/2012 |
| EP | 1 351 310 A2 | 10/2003 |

OTHER PUBLICATIONS

Second Chinese Office Action Appln. No. 201210262839.3; Dated Dec. 2, 2014.
International Search Report Issued Apr. 7, 2013 Appln. No. PCT/CN2012/085186.
First Chinese Office Action Issued Jun. 4, 2014 Appln. No. 201210262839.3.

* cited by examiner

SENSOR AND METHOD FOR FABRICATING THE SAME

FIELD OF THE ART

Embodiments of the invention relate to a sensor and a method for fabricating the same.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is sensor.

FIG. 1 illustrates a basic configuration of a sensor. The sensor 12 comprises a plurality of scan lines 15, a plurality of data lines 16 and a plurality of sensing elements, each of the sensing elements comprises a photodiode 13 and a field effect transistor (FET) 14. The gate of the FET 14 is connected with a corresponding scan line 15 of the sensor 12, the drain of the FET 14 is connected with a corresponding data line 16 of the sensor, and the source of the FET 14 is connected with the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected with the FET 14 and the data readout circuit 18, and capturing of the photocurrent signal is realized by controlling signal timing on the scan line 15 and the data line 16. That is to say, the capturing of the photocurrent signal is controlled by controlling the ON/OFF state of the FET 14.

Currently, sensors generally employ a thin film transistor (TFT) plate configuration. Such a sensor may have many layers in its cross section, for example, each sensing element comprises a substrate, a gate electrode layer, a gate insulating layer, an active layer, a source electrode and a drain electrode layer, a passivation layer, PIN junction of the PIN photosensor and transparent electrode window layer, and a bias line layer as well as a light-shield strip layer. Detailed patterning layers may differ from each other for different sensors, depending on the specific configuration of the sensors.

Individual patterning layers of the sensor are generally formed via patterning processes and each patterning process generally comprises steps of masking, developing, exposure, etching and peeling. That is to say, multiple patterning processes are needed to realize multiple patterning layers of the sensor. For example, 9 to 11 patterning processes are needed to form a multi-layer sensor as described above, thereby 9 to 11 masks are required, which makes the fabrication cost high and the process complicated and the production capacity difficult to increase.

SUMMARY

The invention aims to provide a sensor and its fabrication method so as to overcome the technical problems of sensors having high production cost and complicated fabrication processes and difficulty in improving the production capacity.

A first aspect of the invention provides a sensor, comprising: a base substrate, a group of gate lines and a group of data lines arranged as crossing each other, and a plurality of sensing elements arranged in an array and defined by the group of gate lines and the group of data lines, each sensing element comprising a Thin Film Transistor (TFT) device and a photodiode sensing device, wherein:

the TFT device comprises: a source electrode and a drain electrode arranged as opposed to each other to form a channel, wherein the drain electrode is connected with a neighboring data line; an ohmic layer disposed on the source electrode and the drain electrode; an active layer disposed on the ohmic layer and overlaying the channel; a gate insulating layer disposed on the active layer; and a gate electrode which is disposed on the gate insulating layer and over the channel and connected with a neighboring gate line;

the photodiode sensing device comprises: a receiving electrode connected with the source electrode; a photodiode disposed on the receiving electrode; a transparent electrode disposed on the photodiode; and a bias line disposed on the transparent electrode and connected with the transparent electrode, wherein the bias line is disposed as parallel to the gate line.

A second aspect of the invention provides a method for fabricating a sensor comprising:

forming, on a base substrate, a pattern of a source electrode and a drain electrode, a pattern of a data line connected with the drain electrode, and a pattern of a receiving electrode connected with the source electrode, by using a first patterning process, wherein the source electrode and the drain electrode are disposed opposed to each other to form a channel;

forming a pattern of photodiode disposed on the receiving electrode and a pattern of a transparent electrode disposed on the photodiode, by using a second patterning process;

forming a pattern of an ohmic layer on the source electrode and the drain electrode, by using a third patterning process;

forming a pattern of an active layer which is disposed on the ohmic layer and overlays the channel, by using a fourth patterning process;

forming a gate insulating layer overlaying the substrate, by using a fifth patterning process, wherein the gate insulating layer has a through hole over the transparent electrode; and forming a pattern of a gate electrode which is disposed on the gate insulating layer and over the channel, a pattern of a gate line connected with the gate electrode, and a pattern of a bias line connected with the transparent electrode via the through hole and over the transparent electrode, using a sixth patterning process.

A third aspect of the invention further provides a method for fabricating a sensor, comprising:

forming, on a base substrate, a pattern of a bias electrode, a pattern of a bias electrode pin connected with the bias electrode, a pattern of a photodiode disposed on the bias electrode and a pattern of a transparent electrode disposed on the photodiode, by using a first patterning process;

forming a pattern of a first passivation layer which is disposed on the transparent electrode as well as the bias electrode pin and overlays the base substrate, by using a second patterning process;

forming a pattern of a source electrode, a drain electrode and a date line and a pattern of an ohmic layer on the source electrode and the drain electrode, by using a third patterning process, wherein the source electrode and the drain electrode are disposed opposed to each other to form a channel, the drain electrode is connected with the data line, the source electrode is connected with the transparent electrode;

forming a pattern of an active layer which is disposed on and overlays the channel, by using a fourth patterning process;

forming a pattern of a gate insulating layer disposed on the active layer, a pattern of a gate electrode disposed on the gate insulating layer and over the channel, and a pattern of a gate line connected with the gate electrode, by using a fifth patterning process.

The TFT sensing device of the sensor in accordance with the embodiment of the invention is a top gate TFT. In comparison with the conventional technologies, the method for fabricating the sensor in accordance with the invention reduces the number of used masks and the production cost, and improves the production capacity and defect free rate of the products.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
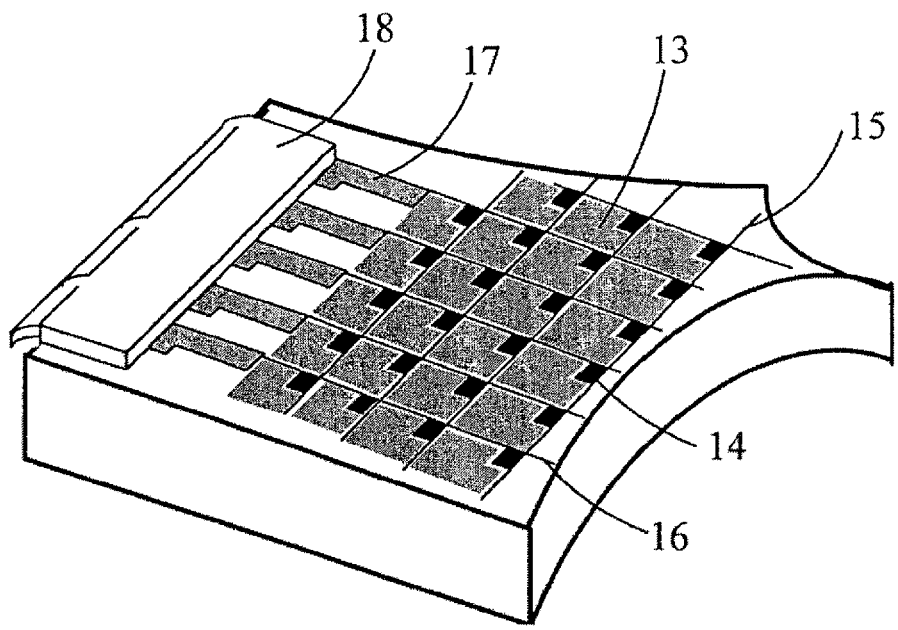
FIG. 1 schematically illustrates a three-dimensional (3-D) configuration of a conventional sensor.

12: sensor; 13: photodiode; 14: field effect transistor (FET) 15: scan line 16: data line 17: connecting pin
18: data readout circuit 30: gate line 31: data line
32: base substrate 33: source electrode 34 drain electrode
35: ohmic layer 36: active layer 37: gate insulating layer
38: gate electrode 57: second passivation layer 40: photodiode
41: transparent electrode 42a: bias electrode 40a: N-type semiconductor
40b: I-type semiconductor 40c: P-type semiconductor 43: first passivation layer
42b: bias electrode pin 42: bias line 39: receiving electrode
44: passivation layer

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the invention described below, a sensor may be an X-ray sensor or other type of sensors, such as a sensor for transmitting signals via photo-electric conversion. The following descriptions and drawings are for a single sensing element while other sensing elements may be formed in the same way.

Embodiments of the invention provide a sensor and its fabrication method to address the technical problems of sensors having high cost and complicated fabrication processes in the conventional art.

Figure 2:
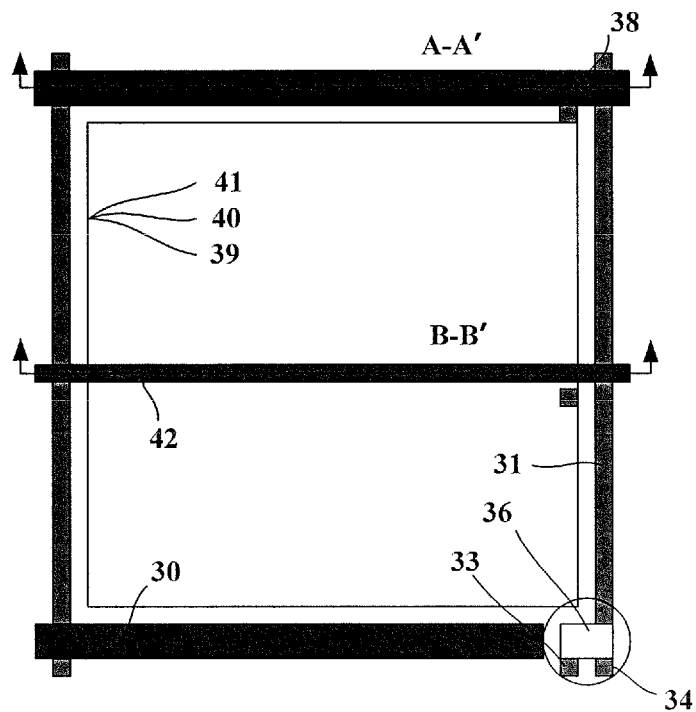
FIG. 2 is a top view of a sensing element of a sensor in accordance with an embodiment of the invention.
Figure 9A:
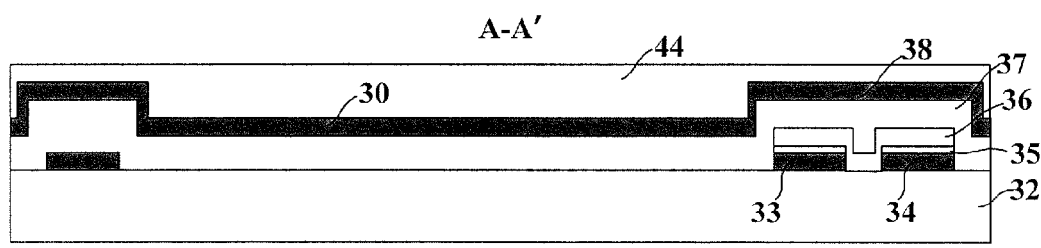
FIG. 9a schematically illustrates a cross section taken along the line A-A' of FIG. 2 after the seventh patterning process for the sensing element in accordance with an embodiment of the invention.
Figure 9B:
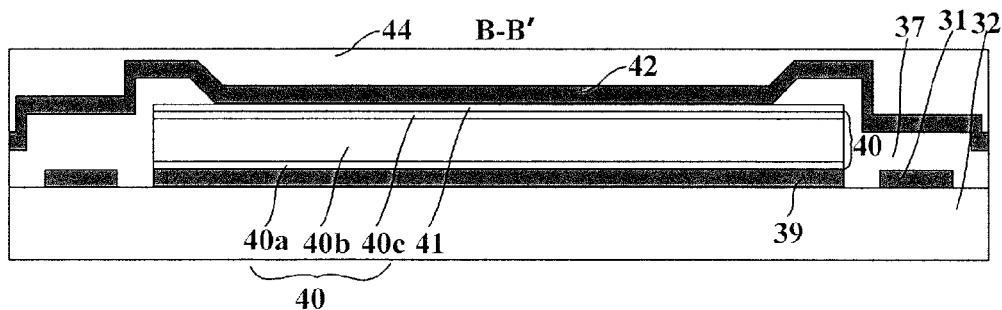
FIG. 9b schematically illustrates a cross section taken along the line B-B' of FIG. 2 after the seventh patterning process for the sensing element in accordance with an embodiment of the invention.

FIG. 2 is a top view of a sensing element of a sensor in accordance with an embodiment of the invention. FIGS. 9a and 9b are cross section views of the sensing element along the lines A-A' and B-B' of FIG. 2, respectively. As illustrated in FIGS. 2, 9a and 9b, the sensor comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises a TFT device and a photodiode sensing device, in which:

The TFT device comprises: a source electrode 33 and a drain electrode 34 arranged opposed to each other to form a channel, where the drain electrode 34 is connected with a neighboring data line 31; an ohmic layer 35 disposed on the source electrode 33 and the drain electrode 34; an active layer 36 disposed on the ohmic layer 35 and overlaying the channel; a gate insulating layer 37 disposed on the active layer 36; and a gate electrode 38 disposed on the gate insulating layer 37 and over the channel and connected with a neighboring gate line 30.

The photodiode sensor device comprises: a receiving electrode 39 connected with the source electrode 33; a photodiode (PD) 40 disposed on the receiving electrode 39; a transparent electrode 41 disposed on the PD 40; and a bias line 42 disposed on the transparent electrode 41 and connected with the transparent electrode 41, where the bias line 42 is arranged as parallel to the gate line 30.

In an embodiment of the invention, the base substrate 32 may be a glass substrate, a plastic substrate or a substrate made of other materials; the gate line 30, the gate electrode 38, the date line 31, the source electrode 33, the drain electrode 34, the receiving electrode 39 and the bias line 42 (as well as a bias electrode 42a and a bias electrode pin 42b) may be of the same material such as a single layer film made of aluminum neodymium (AlNd) alloy, aluminum (Al), copper (Cu), molybdenum (Mo), molybdenum tungsten (MoW) alloy or chromium (Cr), or a multi-layer film made of any combination of these metal elements or alloy materials. The single layer or multi-layer film may have a thickness of for example 150 nm to 450 nm.

In an embodiment of the invention, a material of the ohmic layer 35 may be for example a doped semiconductor (n+a-Si); a material of the active layer 36 may be a semiconducting material, such as, amorphous silicon (a-Si), with a thickness of 30 nm to 250 nm; a material of the gate insulating layer 37 may be silicon nitrides with a thickness of 300 nm to 500 nm; a material of the transparent electrode 41 may be transparent conductive materials such as indium tin oxides (ITO) or indium zinc oxides (IZO).

In an embodiment of the invention, the photodiode is a PIN photodiode, comprising: an N-type semiconductor (n+a-Si) 40a disposed on the receiving electrode 39, a I-type semiconductor (a-Si) 40b disposed on the N-type semiconductor 40a, and a P-type semiconductor (p+a-Si) 40c disposed on the I-type semiconductor. A PIN photodiode has the advantages of having small junction capacitance, short transit time and high sensitivity and is therefore a preferred choice. In other configurations of the invention, the photodiode may be a MIS (Metal-Insulator-Semiconductor)-type photodiode and the like.

Still referring to FIGS. 2, 9a and 9b, in an embodiment, the gate insulating layer 37 overlays the base substrate and has a through hole which is over the transparent electrode 41 and connects the transparent electrode 41 with the bias line 42. In an embodiment, the sensor may further comprises: a passivation layer 44 disposed on the bias line 42, the gate line 30 and the gate electrode 38 and overlaying the base substrate, where the passivation layer 44 has a signal-transmitting region via hole (FIGS. 9a and 9b illustrate a cross section of a sensing element, therefore, the signal-transmitting region via hole at the peripheral of the base substrate is not shown). The passivation layer 44 (and a first passivation layer 43 as well as a second passivation layer 57 described below) may be made of an inorganic insulating film (such as silicon nitrides) or an organic insulating film (such as a photosensitive resin material or a non-photosensitive resin) with a thickness of, for example, 150 nm to 1500 nm.

The TFT device of the sensor in accordance with the embodiment is a top gate TFT and the sensor is fabricated through seven patterning processes, which reduces the number of masks used in the fabrication and the production cost, in comparison with conventional production processes, and improves the production capacity and defect free rate of the products.

In accordance with an embodiment of the invention, a method for fabricating the above sensor comprises:

Step 101: a first patterning process is used to form, on the base substrate 32, a pattern of the source electrode 33 and the drain electrode 34, a pattern of the data line 31 connected with the drain electrode 34, and a pattern of the receiving electrode 39 connected with the source electrode 33, where the source electrode 33 and the drain electrode 34 are disposed as opposed to each other to form the channel. A cross section after the first patterning process is illustrated in FIGS. 3a and 3b.

Figure 3A:
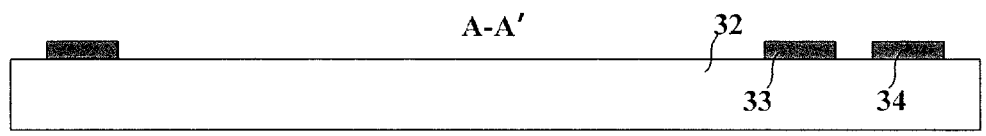
FIG. 3a schematically illustrates a cross section taken along the line A-A' of FIG. 2 after the first patterning process for the sensing element in accordance with an embodiment of the invention.
Figure 3B:
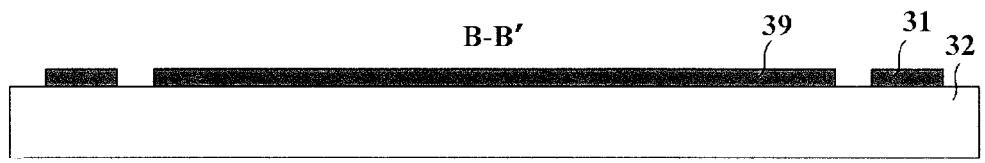
FIG. 3b schematically illustrates a cross section taken along the line B-B' of FIG. 2 after the first patterning process for the sensing element in accordance with an embodiment of the invention.

FIGS. 3a and 3b illustrate the cross section of the base substrate after the first patterning process. FIGS. 2, 9a and 9b are respectively the top view and the cross section of the sensing element finally obtained after seven processes. Therefore, the base substrate as illustrated in FIGS. 3a and 3b is only a cross section taken along the lines A-A' and B-B' of FIG. 2 and does not represent real cross section of the base substrate of FIG. 2. Similarly, FIGS. 4a to 8b are illustrated in the same way.

A patterning process sequentially comprises steps of substrate cleaning, film forming, photoresist application, exposure, developing, etching, photoresist removal and so on. The substrate may be cleaned using de-ionized water or an organic cleanser. The film forming process is to form the structural layers to be patterned. For example, a metal layer is generally formed using Physical Vapor Deposition (PVD), such as magnetron sputtering, and then wet etched to form a pattern. While a non-metal layer is usually formed using Chemical Vapor Deposition (CVD) and then dry etched to form a pattern. Patterning processes in the following steps are the same and will not be described.

Figure 4A:
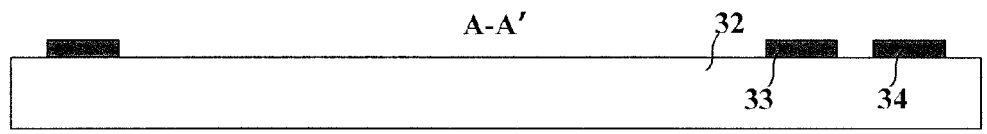
FIG. 4a schematically illustrates a cross section taken along the line A-A' of FIG. 2 after the second patterning process for the sensing element in accordance with an embodiment of the invention.
Figure 4B:
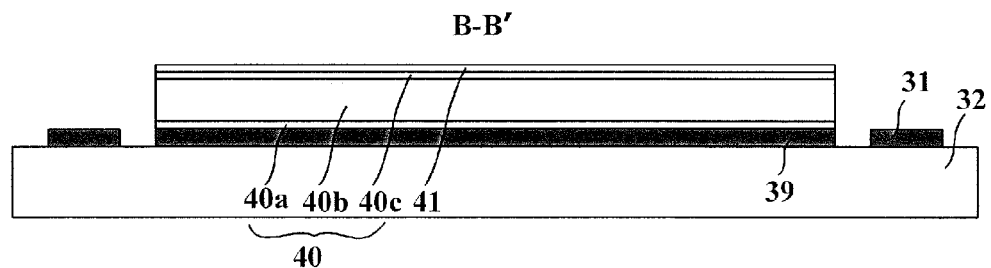
FIG. 4b schematically illustrates a cross section taken along the line B-B' of FIG. 2 after the second patterning process for the sensing element in accordance with an embodiment of the invention.

Step 102: a patterning process is used to form a pattern of the photodiode 40 on the receiving electrode 39 and a pattern of the transparent electrode 41 on the photodiode 40. A cross section after the second patterning process is illustrated in FIGS. 4a and 4b.

As an example, when the photodiode 40 is a PIN photodiode, the step 102 may comprises:

An N-type semiconductor layer, an I-type semiconductor layer, a P-type semiconductor layer and a transparent electrode layer are sequentially deposited, and the patterns of the photodiode 40 and the transparent electrode 41 are formed through a single patterning process.

In the patterning process, the pattern of the transparent electrode 41 may be formed using wet etching single or may be formed at the same time with the pattern of the photodiode 40 using dry etching.

Figure 5A:
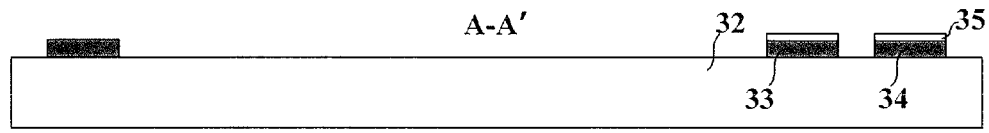
FIG. 5a schematically illustrates a cross section taken along the line A-A' of FIG. 2 after the third patterning process for the sensing element in accordance with an embodiment of the invention.
Figure 5B:
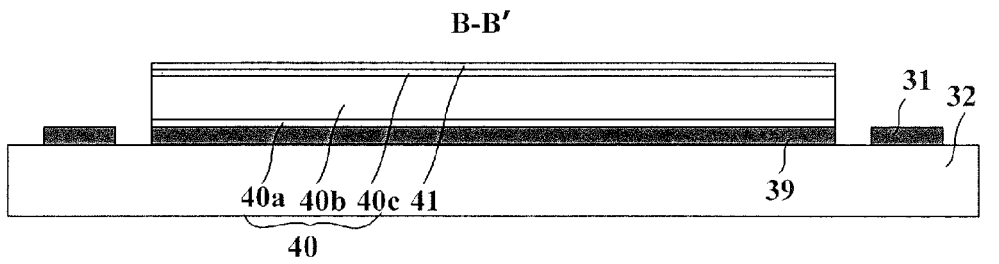
FIG. 5b schematically illustrates a cross section taken along the line B-B' of FIG. 2 after the third patterning process for the sensing element in accordance with an embodiment of the invention.

Step 103: a patterning process is used to form a pattern of the ohmic layer 35 on the source electrode 33 and the drain electrode 34, A cross section after the third patterning process is illustrated in FIGS. 5a and 5b.

Figure 6A:
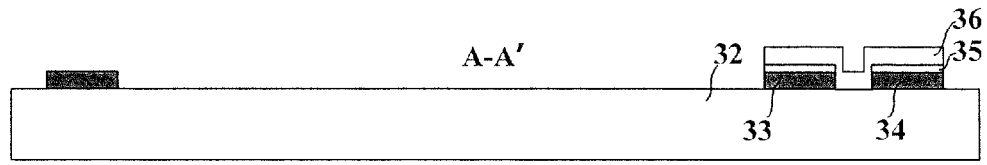
FIG. 6a schematically illustrates a cross section taken along the line A-A' of FIG. 2 after the fourth patterning process for the sensing element in accordance with an embodiment of the invention.
Figure 6B:
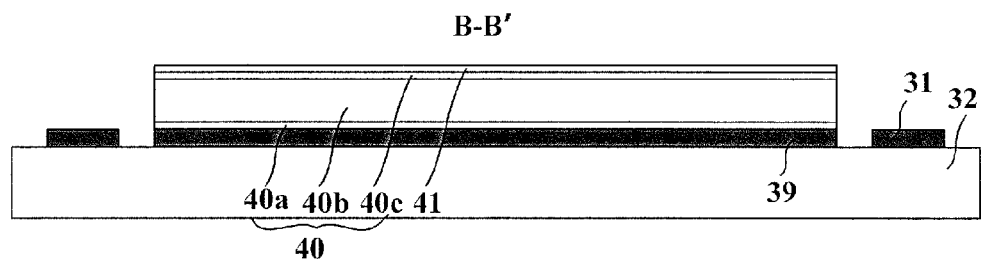
FIG. 6b schematically illustrates a cross section taken along the line B-B' of FIG. 2 after the fourth patterning process for the sensing element in accordance with an embodiment of the invention.

Step 104: a patterning process is used to form a pattern of the active layer 36 which is disposed on the ohmic layer 35 and overlays the channel. A cross section after the fourth patterning process is illustrated in FIGS. 6a and 6b.

Figure 7A:
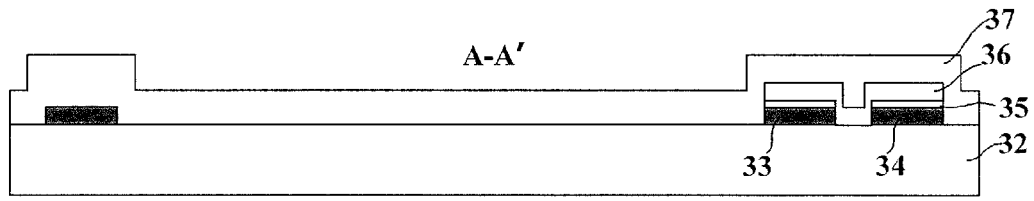
FIG. 7a schematically illustrates a cross section taken along the line A-A' of FIG. 2 after the fifth patterning process for the sensing element in accordance with an embodiment of the invention.
Figure 7B:
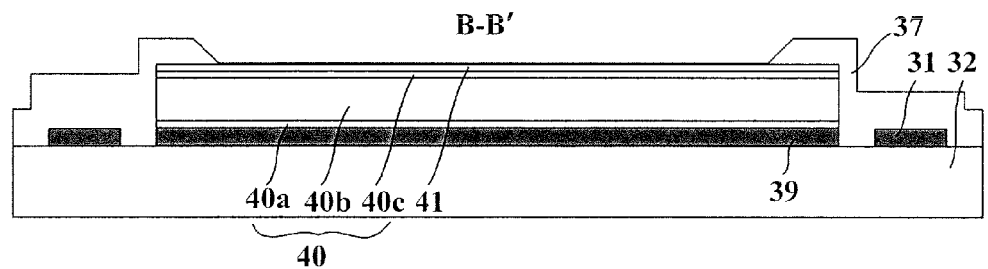
FIG. 7b schematically illustrates a cross section taken along the line B-B' of FIG. 2 after the fifth patterning process for the sensing element in accordance with an embodiment of the invention.

Step 105: a patterning process is used to form a pattern of the gate insulating layer 37 which has a through hole over the transparent electrode 41. A cross section after the fifth patterning process is illustrated in FIGS. 7a and 7b.

Figure 8A:
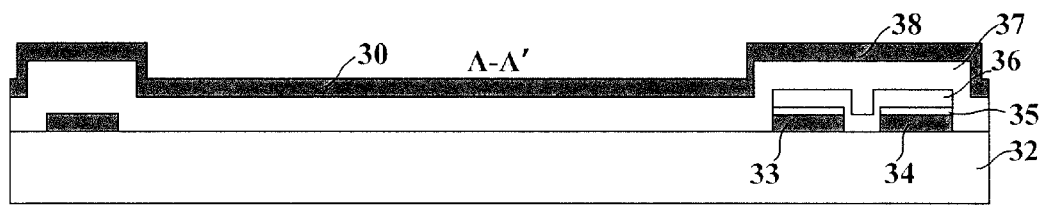
FIG. 8a schematically illustrates a cross section taken along the line A-A' of FIG. 2 after the sixth patterning process for the sensing element in accordance with an embodiment of the invention.
Figure 8B:
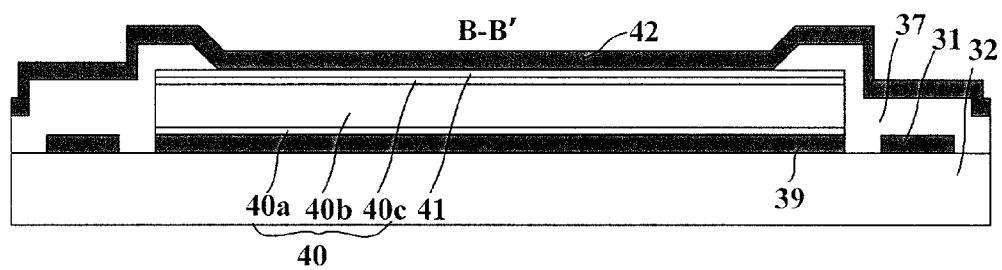
FIG. 8b schematically illustrates a cross section taken along the line B-B' of FIG. 2 after the sixth patterning process for the sensing element in accordance with an embodiment of the invention.

Step 106: a patterning process is used to form a pattern of the gate electrode 38 disposed on the gate insulating layer 37 and over the channel, a pattern of the gate line 30 connected with the gate electrode 38 and a pattern of the bias line 42 which is disposed on the transparent electrode 41 and connected with the transparent electrode 41 via the through hole. A cross section after the sixth patterning process is illustrated in FIGS. 8a and 8b.

Furthermore, the method may further comprises the following step after step 106:

Step 107: a patterning process is used to form a pattern of the passivation layer 44 overlying the base substrate, where the passivation layer 44 has a signal-transmitting region via hole. For the cross section after the seventh patterning process please refer to FIGS. 9a and 9b. (which are the cross sections of a sensing element, therefore the signal-transmitting region via hole located at the peripheral of the substrate are not shown in the figure).

Step 107 is optional, as the invention can still be realized without step 107. Therefore, in an embodiment, the method for fabricating the sensor only comprises the above steps 101 to 106.

It is seen from above that the fabrication method for the sensor of the invention can use six or seven patterning processes in total. In comparison with the prior art, it reduces the number of used mask as well as the production cost and simplifies the production process, thereby significantly improves the production capacity and the defect free rate.

Another sensor is provided in accordance with another embodiment of the invention. As illustrated in FIGS. 10, 16a, 16b and 16c, the sensor comprises: a base substrate 32, a group of gate lines 30 and a group of data lines arranged as crossing each other, and a plurality of sensing elements arranged in an array and defined by the group of gate lines 30 and the group of data lines 31. Each sensing element comprises a TFT device and a photodiode sensing device, in which:

The TFT device comprises: a source electrode 33 and a drain electrode 34 arranged opposed to each other to form a channel, where the drain electrode 34 is connected with a neighboring data line 31; an ohmic layer 35 disposed on the source electrode 33 and the drain electrode 34; an active layer 36 disposed on the ohmic layer 35 and overlaying the channel; a gate insulating layer 37 on the active layer 36; and a gate electrode 38 on the gate insulating layer 37 and over the channel and connected with a neighboring gate line 30.

The photodiode sensor device comprises: a bias electrode 42a and a bias electrode pin 42b disposed on the base substrate 32, the bias electrode pin 42b is connected with the bias electrode 42a; a photodiode 40 disposed on the bias electrode 42a; and a transparent electrode 41 disposed on the photodiode 40 and connected with the source electrode 33.

In an embodiment, the photodiode is a PIN photodiode, comprising: an N-type semiconductor (n+a-Si) 40a disposed on the bias electrode 42a, an I-type semiconductor (a-Si) 40b disposed on the N-type semiconductor 40a, and a P-type semiconductor (p+a-Si) 40c disposed on the I-type semiconductor 40b.

In an embodiment, the sensor may further comprises:

A first passivation layer 43 disposed on the transparent electrode 41 and the bias electrode pin 42b of each of the photodiode sensing device and overlaying the base substrate, where the first passivation layer 43 has a groove for accommodating the source electrode 33, the drain electrode 34, the data line 31 and the ohmic layer 35, and a through hole for connecting the source electrode 33 and the transparent electrode 41, the source electrode 33, the drain electrode 34 and the data line 31 are disposed on the first passivation layer.

Figure 16A:
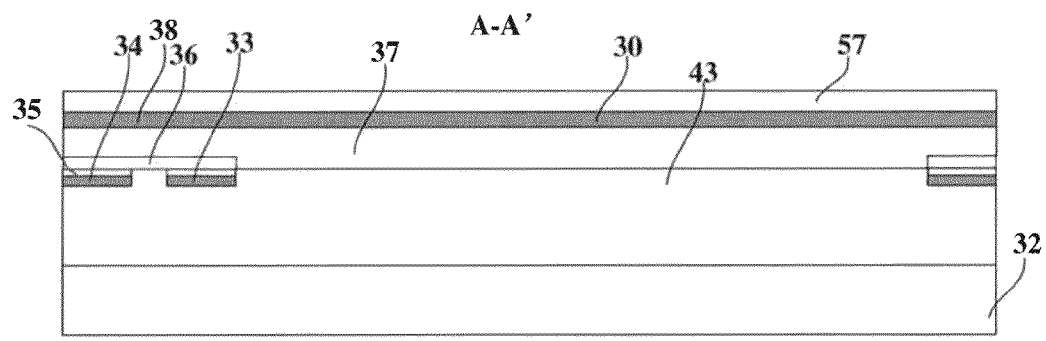
FIG. 16a schematically illustrates a cross section taken along the line A-A' of FIG. 10 after the sixth patterning process for the sensing element in accordance with another embodiment of the invention.
Figure 16B:
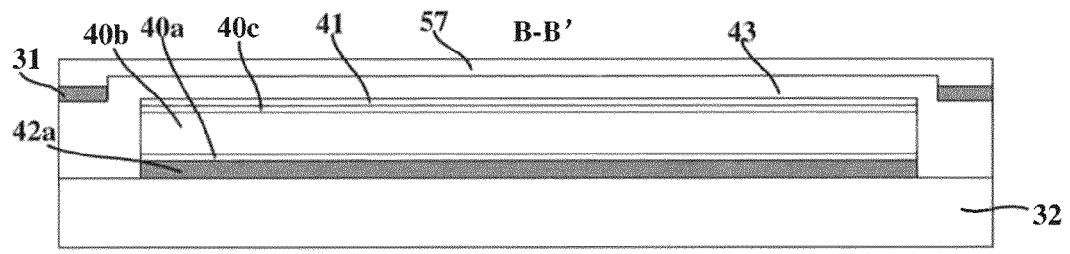
FIG. 16b schematically illustrates a cross section taken along the line B-B' of FIG. 10 after the sixth patterning process for the sensing element in accordance with another embodiment of the invention.
Figure 16C:
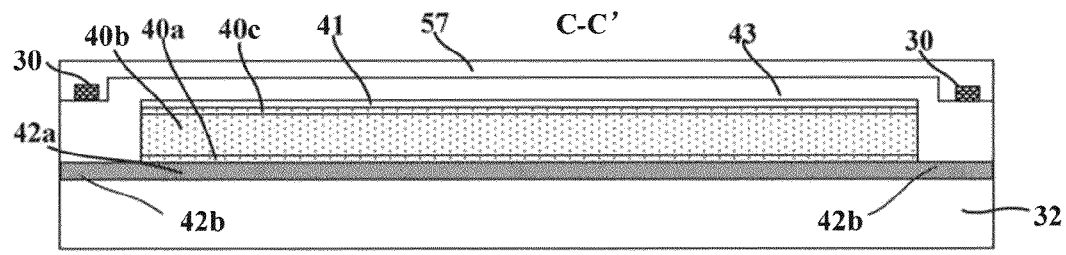
FIG. 16c schematically illustrates a cross section taken along the line C-C' of FIG. 10 after the sixth patterning process for the sensing element in accordance with another embodiment of the invention.

In an embodiment, the sensor may further comprises a second passivation layer 57 disposed on the gate line 30 and the gate electrode 38 of each of the TFT device and overlaying the base substrate, where the second passivation layer 57 has a signal transmitting region via hole (FIGS. 16a and 16b illustrate a cross section of a sensing element, therefore, the signal-conducting via hole at the peripheral of the base substrate is not shown).

In accordance with an embodiment of the invention, a method for fabricating the above sensor comprises:

Step 101: a first patterning process is used to form, on the base substrate 32, a pattern of the bias electrode 42a, a pattern of the bias electrode pin 42b connected with the bias electrode 42a, a pattern of the photodiode 40 disposed on the bias electrode 42a and a pattern of the transparent electrode 41 disposed on the photodiode 40. A cross section after the first patterning process is illustrated in FIGS. 11a, 11b and 11c.

Figure 10:
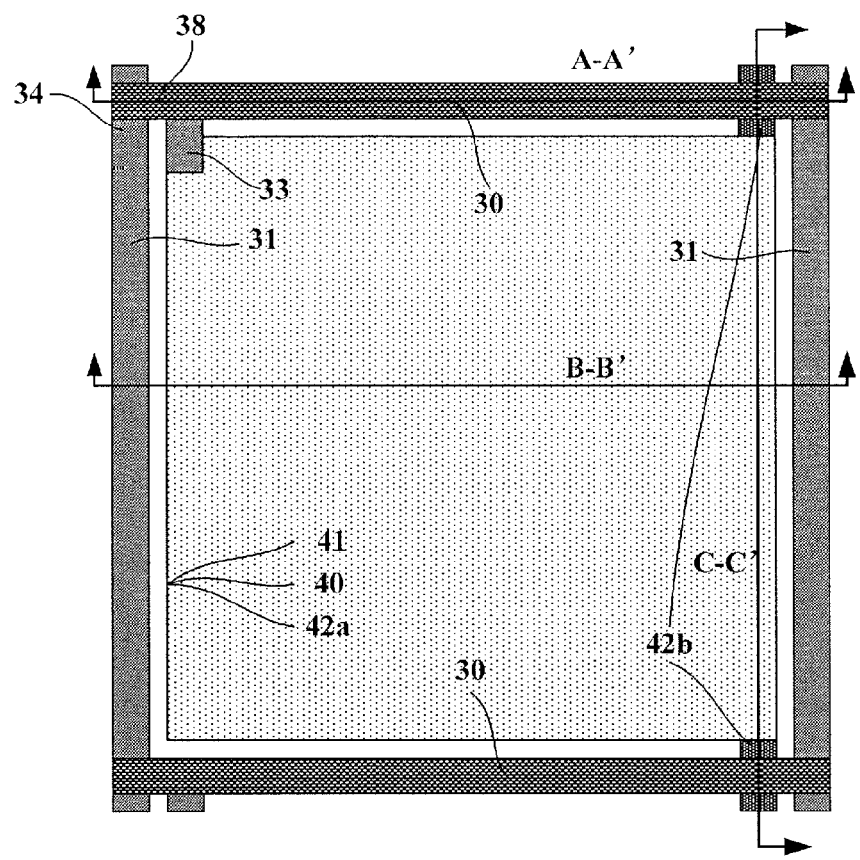
FIG. 10 schematically illustrates a top view of a sensing element of a sensor in accordance with another embodiment of the invention.
Figure 11A:
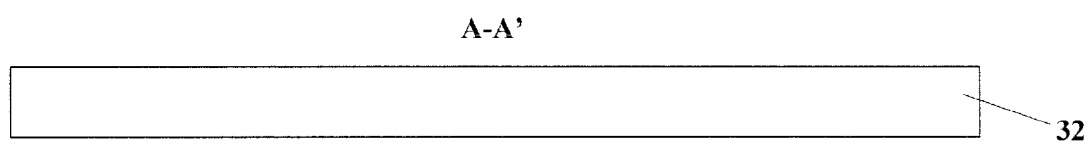
FIG. 11a schematically illustrates a cross section taken along the line A-A' of FIG. 10 after the first patterning process for the sensing element in accordance with another embodiment of the invention.
Figure 11B:
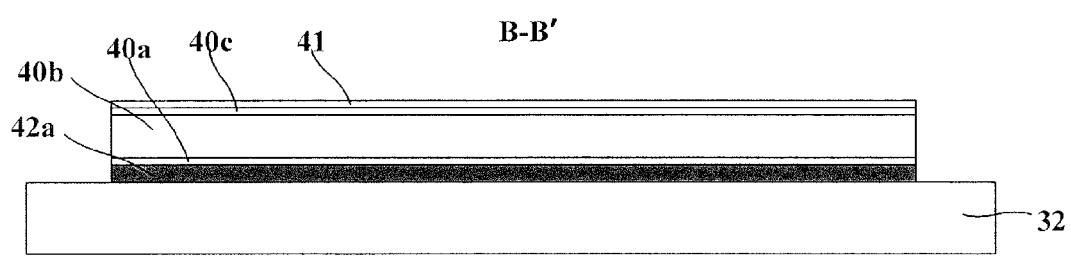
FIG. 11b schematically illustrates a cross section taken along the line B-B' of FIG. 10 after the first patterning process for the sensing element in accordance with another embodiment of the invention.
Figure 11C:
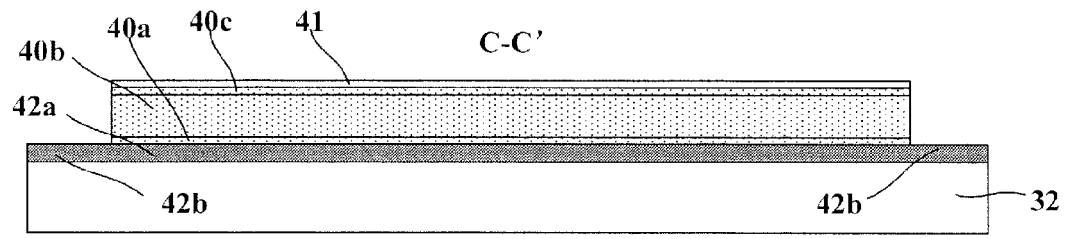
FIG. 11c schematically illustrates a cross section taken along the line C-C' of FIG. 10 after the first patterning process for the sensing element in accordance with another embodiment of the invention.

Please note that the base substrate as illustrated in FIGS. 11a, 11b and 11c is only a similar cross section taken along the lines A-A', B-B' and C-C' in FIG. 10 and does not represent real cross section of the base substrate of FIG. 10. Similarly, FIGS. 12a to 15c are illustrated in the same way.

As an example, when the photodiode 40 is a PIN photodiode, the step 101 may comprises:

101a: sequentially depositing a bias electrode layer, an N-type semiconductor layer, an I-type semiconductor layer, a P-type semiconductor layer and a transparent electrode layer, and applying a photoresist to the transparent electrode layer;

101b: exposing and developing the photoresist on the base substrate using a mask having a light-transmitting portion, a partial-light-transmitting portion and a light-blocking portion to obtain a photoresist pattern having photoresist-completely-retained region, photoresist-partially-removed region and photoresist-completely-removed region;

101c: etching the photoresist-completely-removed region on the base substrate to form the pattern of the bias electrode 42a, the pattern of the photodiode 40 and the pattern of the transparent electrode 41;

101d: ashing the photoresist-partially-removed region on the base substrate to remove the photoresist in the photoresist-partially-removed region and retain the photoresist in the photoresist-completely-retained region, and then etching and removing the photoresist to form the pattern of the bias electrode pin 42b.

In the above description, positive photoresist is used as the example, in which the light-transmitting portion, the partial-light-transmitting portion and the light-blocking portion of the mask are used to expose the photoresist completely, partially and not at all respectively, and the photoresist is developed to obtain the photoresist-completely-retained region, photoresist-partially-removed region and photoresist-completely-removed region. The photoresist in the photoresist-completely-retained region is substantially completely retained.

In the above step 101b, the light-blocking portion correspondingly forms the region having the bias electrode 42a, the PIN photodiode 40 and the transparent electrode 41; the partial-light-transmitting portion correspondingly forms the region having the bias electrode pin 42b. Moreover, the used mask is specifically a dual-tone mask (such as a gray-tone mask or a half-tone mask).

Figure 12A:
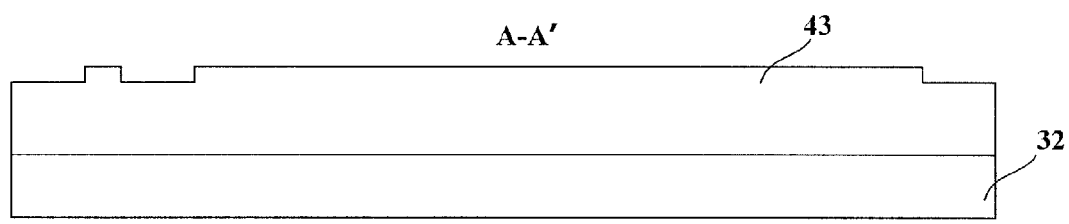
FIG. 12a schematically illustrates a cross section taken along the line A-A' of FIG. 10 after the second patterning process for the sensing element in accordance with another embodiment of the invention.
Figure 12B:
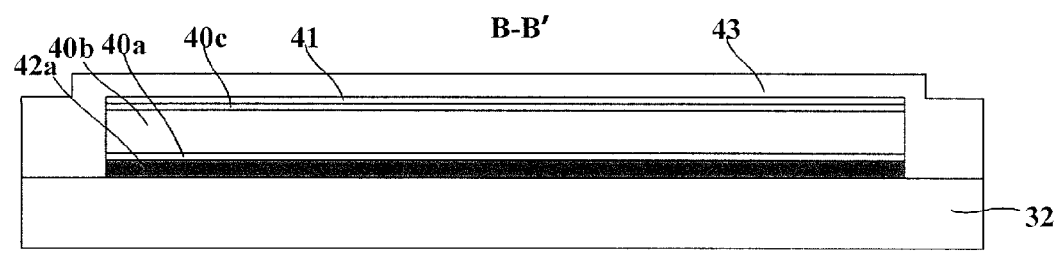
FIG. 12b schematically illustrates a cross section taken along the line B-B' of FIG. 10 after the second patterning process for the sensing element in accordance with another embodiment of the invention.
Figure 12C:
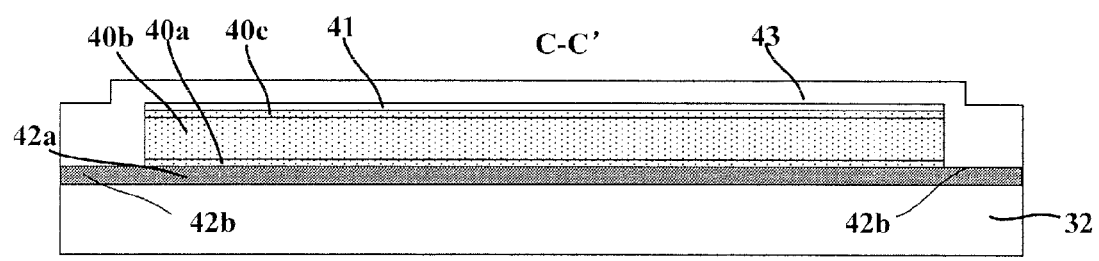
FIG. 12c schematically illustrates a cross section taken along the line C-C' of FIG. 10 after the second patterning process for the sensing element in accordance with another embodiment of the invention.

Step 102: a patterning process is used to form a pattern of the first passivation layer 43 which is disposed on the transparent electrode 41 and the bias electrode pin 42b and overlays the substrate. A cross section after the second patterning process is illustrated in FIGS. 12a, 12b and 12c.

Figure 13A:
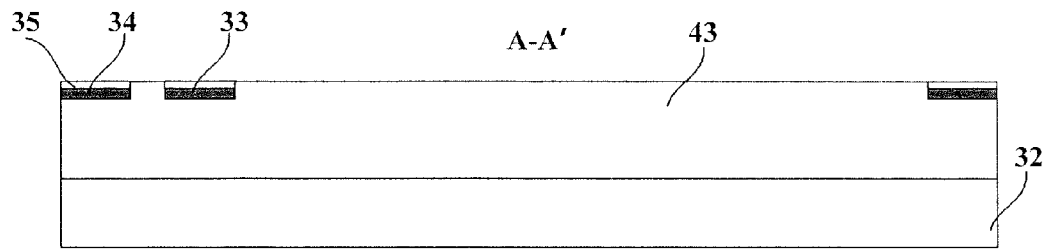
FIG. 13a schematically illustrates a cross section taken along the line A-A' of FIG. 10 after the third patterning process for the sensing element in accordance with another embodiment of the invention.
Figure 13B:
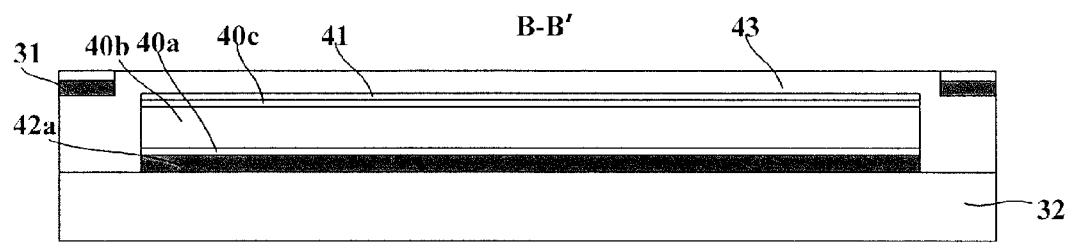
FIG. 13b schematically illustrates a cross section taken along the line B-B' of FIG. 10 after the third patterning process for the sensing element in accordance with another embodiment of the invention.
Figure 13C:
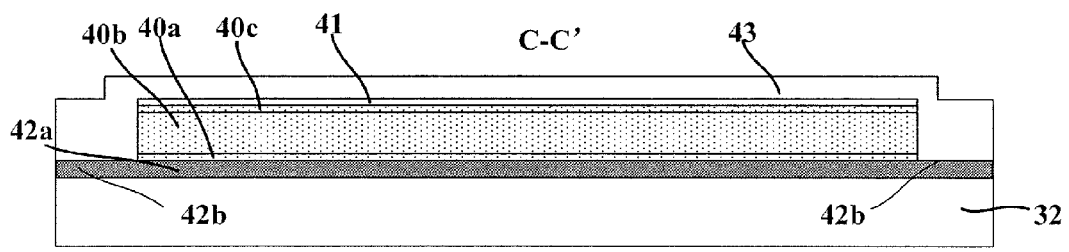
FIG. 13c schematically illustrates a cross section taken along the line C-C' of FIG. 10 after the third patterning process for the sensing element in accordance with another embodiment of the invention.

Step 103: a patterning process is used to form a pattern of the source electrode 33, the drain electrode 34, the data line 31 and a pattern of the ohmic layer 35 on the source electrode 33 and drain electrode 34, where the source electrode 33 and drain electrode 34 are disposed opposed to each other to form the channel, the drain electrode 34 is connected with the data line 31 and the source electrode 33 is connected with the transparent electrode 41. A cross section after the third patterning process is illustrated in FIGS. 13a, 13b and 13c.

Figure 14A:
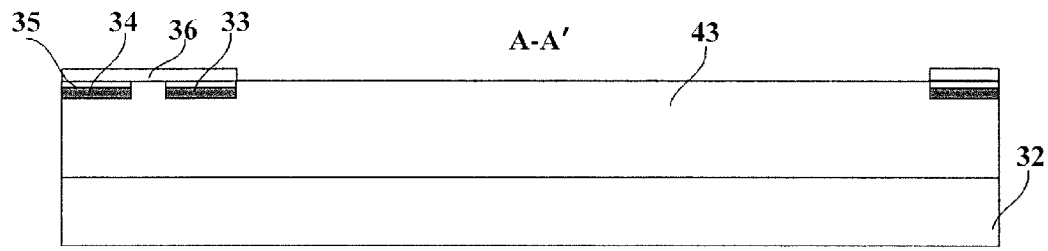
FIG. 14a schematically illustrates a cross section taken along the line A-A' of FIG. 10 after the fourth patterning process for the sensing element in accordance with another embodiment of the invention.
Figure 14B:
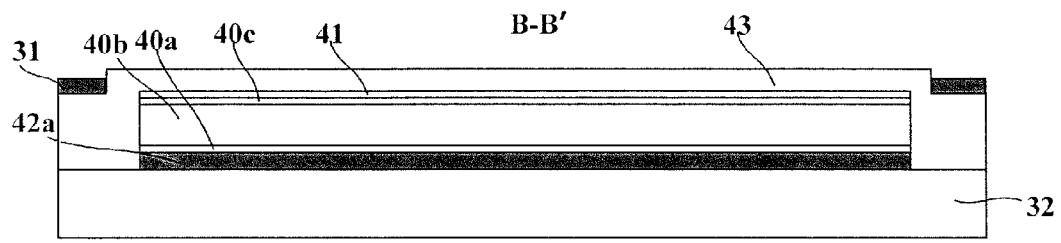
FIG. 14b schematically illustrates a cross section taken along the line B-B' of FIG. 10 after the fourth patterning process for the sensing element in accordance with another embodiment of the invention.
Figure 14C:
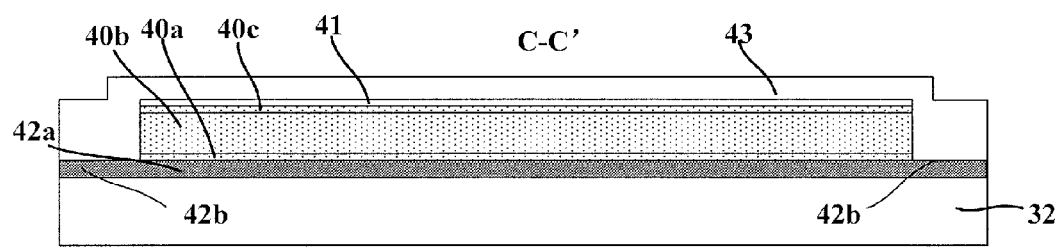
FIG. 14c schematically illustrates a cross section taken along the line C-C' of FIG. 10 after the fourth patterning process for the sensing element in accordance with another embodiment of the invention.

Step 104: a patterning process is used to form a pattern of the active layer 36 which is disposed on the ohmic layer 35 and overlays the channel. A cross section after the fourth patterning process is illustrated in FIGS. 14a, 14b and 14c.

Figure 15A:
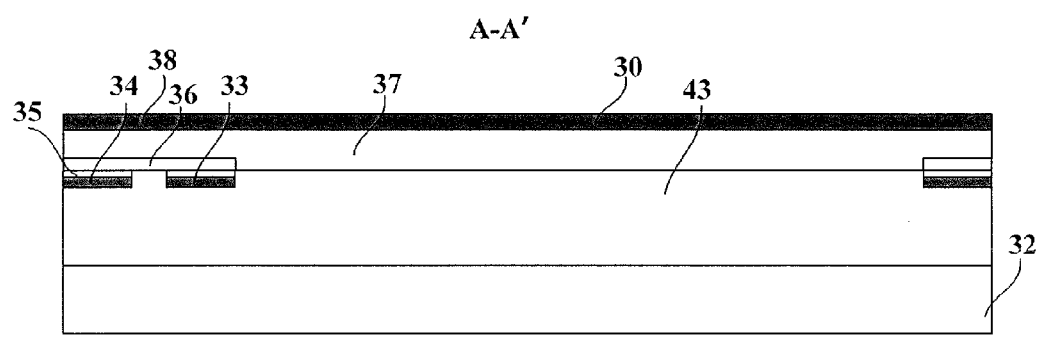
FIG. 15a schematically illustrates a cross section taken along the line A-A' of FIG. 10 after the fifth patterning process for the sensing element in accordance with another embodiment of the invention.
Figure 15B:
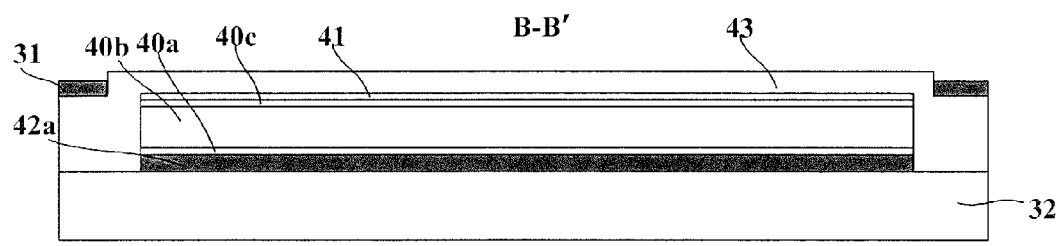
FIG. 15b schematically illustrates a cross section taken along the line B-B' of FIG. 10 after the fifth patterning process for the sensing element in accordance with another embodiment of the invention.
Figure 15C:
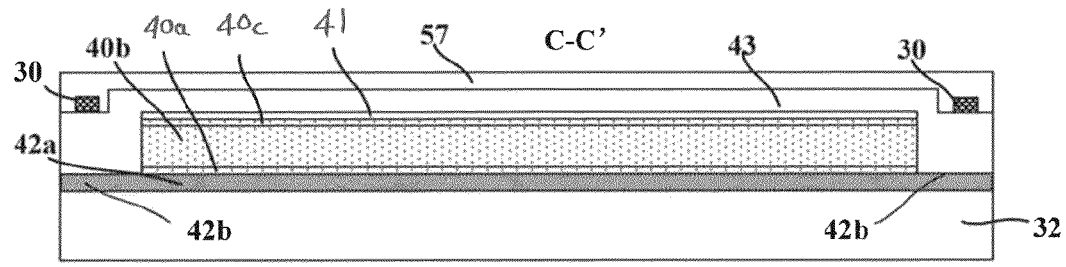
FIG. 15c schematically illustrates a cross section taken along the line C-C' of FIG. 10 after the fifth patterning process for the sensing element in accordance with another embodiment of the invention.

Step 105: a patterning process is used to form a pattern of the gate insulating layer 37 disposed on the active layer 36, a pattern of the gate electrode 38 disposed the gate insulating layer 37 and over the channel, and a pattern of the gate line 30 connected with the gate electrode 38. A cross section after the fifth patterning process is illustrated in FIGS. 15a, 15b and 15c.

Furthermore, the method may further comprises the following step after step 105:

Step 106: a patterning process is used to form a pattern of the second passivation layer 57 overlaying the base substrate, where the second passivation layer 57 has a signal-transmitting region via hole. For the cross section after the sixth patterning process please refer to FIGS. 16a, 16b and 16c (which are the cross sections of a sensing element, therefore the signal-transmitting region via hole located at the peripheral of the substrate are not shown in the figure). Step 106 is optional, as the invention can still be realized without step 106. Therefore, in an embodiment, the method for fabricating the sensor only comprises the above steps 101 to 105.

It is seen from the above description that, the method for fabricating the sensor of the invention employs five or six patterning processes, in comparison with the conventional technology, which reduces the number of mask as well as the production cost and simplifies the production process, thereby significantly improves the production capacity and the defect free rate.

What are described above is related to the illustrative embodiments of the disclosure only and not limitative to the scope of the disclosure; the scopes of the disclosure are defined by the accompanying claims.

What is claimed is:

1. A sensor, comprising: a base substrate, a group of gate lines and a group of data lines arranged as crossing each other, and a plurality of sensing elements arranged in an array and defined by the group of gate lines and the group of data lines, each sensing element comprising a TFT device and a photodiode sensing device, wherein:
the TFT device comprises: a source electrode and a drain electrode arranged as opposed to each other to form a channel, wherein the drain electrode is connected with a neighboring data line; an ohmic layer disposed on the source electrode and the drain electrode; an active layer disposed on the ohmic layer and overlaying the channel; a gate insulating layer disposed on the active layer; and a gate electrode which is disposed on the gate insulating layer and over the channel and connected with a neighboring gate line;
the photodiode sensing device comprises: a receiving electrode connected with the source electrode; a photodiode disposed on the receiving electrode; a transparent electrode disposed on the photodiode; and a bias line disposed on the transparent electrode and connected with the transparent electrode, wherein the bias line is disposed as parallel to the gate line,
the gate insulating layer overlays the base substrate and has a through hole over the transparent electrode for connecting the transparent electrode and the bias line.

2. The sensor of claim 1, further comprising a passivation layer disposed on the bias line, the gate line as well as the gate electrode and overlaying the base substrate, wherein the passivation layer has a signal-transmitting region via hole.

3. The sensor of claim 1, wherein the photodiode is a PIN photodiode comprising: an N-type semiconductor disposed on the receiving electrode, an I-type semiconductor disposed on the N-type semiconductor, and a P-type semiconductor disposed on the I-type semiconductor.

4. A method for fabricating a sensor comprising:
forming, on a base substrate, a pattern of a source electrode and a drain electrode, a pattern of a data line connected with the drain electrode, and a pattern of a receiving electrode connected with the source electrode, by using a first patterning process, wherein the source electrode and the drain electrode are disposed opposed to each other to form a channel;
forming a pattern of photodiode disposed on the receiving electrode and a pattern of a transparent electrode disposed on the photodiode, by using a second patterning process;
forming a pattern of an ohmic layer disposed on the source electrode and the drain electrode, by using a third patterning process;
forming a pattern of an active layer which is disposed on the ohmic layer and overlays the channel, by using a fourth patterning process;
forming a pattern of a gate insulating layer by using a fifth patterning process, wherein the gate insulating layer has a through hole over the transparent electrode; and
forming a pattern of a gate electrode which is disposed on the gate insulating layer and over the channel, a pattern of a gate line connected with the gate electrode, and a pattern of a bias line connected with the transparent electrode via the through hole and over the transparent electrode, by using a sixth patterning process.

5. The method of claim 4, further comprising:
forming a pattern of a passivation layer overlaying the base substrate by using a seventh patterning process, wherein the passivation layer has a signal-transmitting region via hole.

6. The method of claim 4, wherein the step of forming the pattern of the photodiode and the pattern of the transparent electrode by using a second patterning process comprises:

sequentially depositing an N-type semiconductor layer, an I-type semiconductor layer, a P-type semiconductor layer and a transparent electrode layer, and forming the pattern of the photodiode and the pattern of the transparent electrode through a single patterning process.

7. A method for fabricating a sensor comprising:
forming, on a base substrate, a pattern of a bias electrode, a pattern of a bias electrode pin connected with the bias electrode, a pattern of a photodiode disposed on the bias electrode and a pattern of a transparent electrode disposed on the photodiode, by using a first patterning process;
forming a pattern of a first passivation layer which is disposed on the transparent electrode and the bias electrode pin and overlays the base substrate, by using a second patterning process;
forming a pattern of a source electrode, a drain electrode and a date line and a pattern of an ohmic layer disposed on the source electrode and the drain electrode, by using a third patterning process, wherein the source electrode and the drain electrode are disposed opposed to each other to form a channel, the drain electrode is connected with the data line, the source electrode is connected with the transparent electrode;
forming a pattern of an active layer which is disposed on and overlays the channel, by using a fourth patterning process;
forming a pattern of a gate insulating layer disposed on the active layer, a pattern of a gate electrode disposed on the gate insulating layer and over the channel, and a pattern of a gate line connected with the gate electrode, by using a fifth patterning process.

8. The method of claim 7, further comprising:
forming a pattern of a second passivation layer overlaying the base substrate by using a sixth patterning process, wherein the second passivation layer has a signal-transmitting region via hole.

9. The method of claim 7, wherein the step of forming the pattern of the bias electrode, the pattern of the bias electrode pin, the pattern of the photodiode and the pattern of the transparent electrode by using the first patterning process comprises:
sequentially depositing, on the base substrate, a bias electrode layer, an N-type semiconductor layer, an I-type semiconductor layer, a P-type semiconductor layer and a transparent electrode layer, and applying a photoresist to the transparent electrode layer;
exposing and developing the photoresist on the base substrate by using a mask having a light-transmitting portion, a partial-light-transmitting portion and a light-blocking portion to obtain a photoresist pattern having photoresist-completely-removed region, photoresist-partially-removed region and photoresist-completely-retained region;
etching the photoresist-completely-removed region on the base substrate to form the pattern of the bias electrode, the pattern of the photodiode and the pattern of the transparent electrode;
ashing the photoresist-partially-removed region on the base substrate to remove the photoresist in the photoresist-partially-removed region and retain the photoresist in the photoresist-completely-retained region, and then etching and removing the photoresist to form the pattern of the bias electrode pin.

10. The method of claim 9, wherein the light-blocking portion of the mask correspondingly forms a region having the bias electrode, the photodiode and the transparent electrode, and the partial-light-transmitting portion of the mask correspondingly forms a region having the bias electrode pin.

11. The sensor of claim 2, wherein the gate insulating layer overlays the base substrate and has a through hole over the transparent electrode for connecting the transparent electrode and the bias line.

* * * * *